(12) United States Patent
Alqahtani et al.

(10) Patent No.: US 11,414,975 B2
(45) Date of Patent: Aug. 16, 2022

(54) QUANTIFYING WELL PRODUCTIVITY AND NEAR WELLBORE FLOW CONDITIONS IN GAS RESERVOIRS

(71) Applicant: Saudi Arabian Oil Company, Dhahran (SA)

(72) Inventors: Ghazi Dhafer Alqahtani, Dhahran (SA); Shahid Manzoor, Al Kubar (SA); Faisal Alnaseef, Rabwah (SA)

(73) Assignee: Saudi Arabian Oil Company, Dhahran (SA)

( * ) Notice: Subject to any disclaimer, the term of this patent is extended or adjusted under 35 U.S.C. 154(b) by 312 days.

(21) Appl. No.: 16/890,225

(22) Filed: Jun. 2, 2020

(65) Prior Publication Data

US 2020/0318468 A1 Oct. 8, 2020

Related U.S. Application Data

(63) Continuation-in-part of application No. 15/807,976, filed on Nov. 9, 2017, now Pat. No. 10,697,283, and
(Continued)

(51) Int. Cl.
| | |
|---|---|
| *G06F 11/30* | (2006.01) |
| *E21B 43/30* | (2006.01) |
| *G01V 99/00* | (2009.01) |
| *G06F 30/20* | (2020.01) |
| *G06Q 10/04* | (2012.01) |

(52) U.S. Cl.
CPC .......... *E21B 43/30* (2013.01); *G01V 99/005* (2013.01); *G06F 30/20* (2020.01); *G06Q 10/04* (2013.01)

(58) Field of Classification Search
CPC ....................................................... E21B 43/30
See application file for complete search history.

(56) References Cited

U.S. PATENT DOCUMENTS

| | | |
|---|---|---|
| 7,389,185 B2 | 6/2008 | Craig |
| 7,620,534 B2 | 11/2009 | Pita et al. |

(Continued)

FOREIGN PATENT DOCUMENTS

| | | |
|---|---|---|
| CN | 107301306 A | 10/2017 |
| CN | 110321575 A | 10/2019 |

(Continued)

OTHER PUBLICATIONS

Ahuja, Ravindra K, et al.; "Network Flows: Theory, Algorithms, and Applications" Prentice-Hall, Inc, 1993; pp. 23-31.
(Continued)

*Primary Examiner* — Phuong Huynh
(74) *Attorney, Agent, or Firm* — Bracewell LLP; Constance G. Rhebergen; Brian H. Tompkins

(57) ABSTRACT

Simulation model cells of a reservoir having gas condensate production from layers of a subsurface hydrocarbon reservoir are determined by the Total Dynamic Productivity Index (TDPI) method. The determinations are based on rock and fluid physics, including non-Darcy flow and pseudo-pressure integral, which are responsible for pressure drop near wellbores in the gas condensate wells. A three-dimensional (3D) grid matrix is linked with a well placement optimization algorithm to target high gas energy spots and increase productivity, efficiency and recovery from the gas condensate wells.

10 Claims, 7 Drawing Sheets

Related U.S. Application Data a continuation-in-part of application No. 14/330,324, filed on Jul. 14, 2014, now Pat. No. 9,816,366.

(56) References Cited

U.S. PATENT DOCUMENTS

| | | | |
|---|---|---|---|
| 7,874,357 | B2 | 1/2011 | Jalali et al. |
| 7,983,885 | B2 | 7/2011 | Suarez-Rivera et al. |
| 8,280,695 | B2 | 10/2012 | Neelamani et al. |
| 9,816,366 | B2 | 11/2017 | Alqahtani et al. |
| 2007/0016389 | A1 | 1/2007 | Ozgen |
| 2007/0038375 | A1 | 2/2007 | Jalali et al. |
| 2007/0083331 | A1 | 4/2007 | Craig |
| 2007/0255500 | A1 | 11/2007 | Pita et al. |
| 2008/0167849 | A1 | 7/2008 | Hales et al. |
| 2010/0084131 | A1 | 4/2010 | Bouzas et al. |
| 2010/0114544 | A1* | 5/2010 | Dogru ............... E21B 49/00 703/10 |
| 2010/0299125 | A1* | 11/2010 | Ding ............... E21B 43/12 703/10 |
| 2011/0022368 | A1 | 1/2011 | Huang et al. |
| 2013/0268248 | A1 | 10/2013 | Bouzarkouna et al. |
| 2014/0136112 | A1 | 5/2014 | Al-Shawaf |

FOREIGN PATENT DOCUMENTS

| | | | |
|---|---|---|---|
| WO | 0123829 | A2 | 4/2001 |
| WO | 2009105650 | A1 | 8/2009 |
| WO | 2010080270 | A1 | 7/2010 |
| WO | 2016010813 | A1 | 1/2016 |

OTHER PUBLICATIONS

Alqahtani, Ghazi et al.; "A Comparison between Evolutionary Metaheuristics and Mathematical Optimization to Solve the Wells Placement Problem" Advances in Chemical Engineering and Science, 2013, 3; pp. 30-36.

Al-Qahtani, Khalid et al.; "Integration and Coordination of Multirefinery Networks: A Robust Optimization Approach" Proceedings of the 19th IASTED International Conference Modelling and Simulation, May 26-28, 2008, Quebec City; pp. 1-8.

Artus, Vincent et al.; "Optimization of nonconventional wells under uncertainty using statistical proxies," Computational Geosciences, (2006) vol. 10, No. 4, pp. 389-404.

Bukhamsin, Ahmed Y. et al; "Optimization of Multilateral Well Design and Location in a Real Field Using a Continuous Genetic Algorithm" SPE 136944, SPE Annual Technical Symposium and Exhibition, Al-Khobar, Saudi Arabia, Apr. 4-7, 2010; pp. 1-16.

Da Cruz, Paulo S. et al.; "The Quality Map: A Tool for Reservoir Uncertainty Quantification and Decision Making" SPE 56578, Feb. 2004 SPE Reservoir Evalutaion & Entineering; pp. 6-14.

Da Cruz, Paulo Sergio et al.' "Reservoir Management Decision-Making in the Presence of Geological Uncertainty" available at: www.ccgalberta.com/ccgresources/report02/2000-117-reservoir_modeling.pdf, 2000; pp. 1-26.

Dasgupta, S. et al; "Algorithms with numbers" Chapter 1: Algorithms, McGraw-Hill, Jul. 18, 2006; p. 21.

Ding, D.Y.; "Optimization of Well Placement Using Evolutionary Algorithms" SPE 113525, SPE Europec/EAGE Annual Conference and Exhibition, Rome, Italy, Jun. 9-12, 2008; pp. 1-18.

ECMOR XVI 2018—16th European Conference on the Mathematics of Oil Recovery, Sep. 3-6, 2018, Barcelona, Spain; pp. 1-15.

Farmer, C.L. et al; "Optimal Multilateral Well Placement" Oxford University Mathematical Institute, Sep. 2010, Report No. 10/06; pp. 1-13.

Harris, John M. et al.; "Combinatorics and Graph Theory", Second Edition, Springer, 2008; p. 34.

International Search Report and Written Opinion for International Application No. PCT/US2015/039710 (SA5264) dated Oct. 9, 2015; pp. 1-10.

International Search Report and Written Opinion for International Application No. PCT/US2015/039732 (SA5265) dated Dec. 14, 2015; pp. 1-12.

International Search Report and Written Opinion for International Application No. PCT/US2018/058088 (SA5852) dated Dec. 19, 2018; pp. 1-14.

Kuchuk, F.J. et al.; "Inflow Performance of Horizontal Wells in Multilayer Reservoirs" SPE 24945, Annual Technical Conference and Exhibition of the Society of Petroleum Engineers, Washington, DC, Oct. 4-7, 1992; pp. 929-940.

Onwunalu, J.E. et al.; "A New Well-Pattern-Optimization Procedure for Large-Scale Field Development," SPE 124364, SPE Journal Sep. 2011; pp. 594-607.

Onwunalu, Jerome; "Optimization of Nonconventional Well Placement Using Genetic Alogorithms and Statistical Proxy" Department of Petroleum Engineering of Stanford University, Jun. 2006; pp. 1-73.

Saggaf, M.M.; "A Vision for Future Upstream Technologies," SPE 109323, Journal of Petroleum Technology, Mar. 2008; pp. 54-55 & 94-98.

Siu, Alan L. et al.; "Re-Engineering the Well Calibration Procedure for a Large Number of High Productivity Wells" SPE 66385, SPE Reservoir Simulation Symposium, Houston, Texas, Feb. 11-14, 2001; pp. 1-9.

Taha, Hamdy, A.; "Transportation Model and Its Variants" Operations Research: An Introduction, 2007, 8th Edition, Chapter 5, Pearson Education Inc.; pp. 193-234.

Vasantharajan, S. et al.; "Well Site Selection Using Integer Programming Optimization" in Proceedings of IAMG'97, V. Pawlowsky-Glahn (Ed.), CIMNE, Barcelona, 1997; pp. 421-426.

Yeten, Burak et al.; "Optimization of Nonconventional Well Type Location and Trajectory" SPE 77565, SPE Annual Technical Conference and Exhibition, San Antonio, TX Sep. 29-Oct. 2, 2002; pp. 1-14.

Faraji, Foad et al.; "Development of inflow performance model in high temperature gas-condensate reservoirs" Journal of Petroleum Science and Engineering 181 (2019) 106169; pp. 1-14.

Hooi, Tan Leong et al.; "Numerical Investigation of Condensate Banking in the North Kuwait Jurassic Gas Condensate Reservoirs" SPE 127234, Kuwait International Petroleum Conference & Exhibition, Kuwait City, Dec. 14-16, 2009; pp. 1-14.

International Search Report and Written Opinion for International Application No. PCT/US2021/034594 (SA51522), dated Sep. 1, 2021; pp. 1-19.

* cited by examiner

QUANTIFYING WELL PRODUCTIVITY AND NEAR WELLBORE FLOW CONDITIONS IN GAS RESERVOIRS

The present application is a continuation in part application of co-pending U.S. patent application Ser. No. 15/807,976, filed Nov. 9, 2017, which is a continuation in part application of U.S. patent application Ser. No. 14/330,324, filed Jul. 14, 2014, now issued as U.S. Pat. No. 9,816,366. Priority to both applications is claimed under the provisions of 35 U.S.C. § 120.

BACKGROUND OF THE INVENTION

1. Field of the Invention

This invention relates to optimizing the placement of wells in gas reservoirs in a gas field. More specifically, the present invention relates to quantifying Well productivity and near wellbore flow conditions in gas reservoirs.

2. Description of the Related Art

Reservoir simulation is an important processing methodology for evaluating development of a gas fields. This is, of course, providing that the simulation results accurately account for the rock and fluid physics taking place. When production from a particular gas field starts, reservoir dynamic conditions are based on an interdependence between several conditions and forces within the reservoir. For instance, high velocity gas flow in low quality rocks results from a higher pressure drop than indicated for normal fluid flow through the permeable formation rock. The normal fluid flow relationship is expressed by what is known as the Darcy flow equation. However, high gas velocity flow due to pressure drop causes a condition known as non-Darcy flow. When modeling gas reservoirs, it has been important to take into account non-Darcy flow due to the impact on wells production rates and pressure drops near well bore or away in the reservoir.

In low porosity and low permeability reservoirs, the contribution of non-Darcy flow also increases according to the total pressure drop which causes the flow rates of a well. Non-Darcy flow is more pronounced in gas condensate reservoirs and unquestionably affects well Productivity Index (PI) calculations. The drive mechanism for conventional gas reservoirs is dominated first by gas expansion and then aquifer support. There is, however, usually no pressure maintenance provided in production from gas reservoirs. Gas reservoirs are typically depleted until pressure and flow conditions are such that there is no economic feasibility in continued production. In the absence of natural aquifer support, pressure in gas reservoirs drops rapidly with accelerated field production and the ability of wells to produce effectively deteriorates with time due to reservoir heterogeneity and other related factors. The productivity or PI for gas wells is a particularly important indicator of how healthy the wells are over time, and are whether the wells are strong or weak producers. PI amalgamates the contribution of the main drive mechanism to produce gas and the critical rock and fluid physics in action for each well which encapsulates reservoir energy performance with time.

For gas reservoir simulation, it is usually known that non-Darcy flow is associated with high flow rates. However, poor quality rocks with low porosity and permeability can also contribute to non-Darcy flow, and can be significant influences even at low production rates. In reservoir simulation or flow modeling, it is very significant to take into account non-Darcy flow conditions in order for gas reservoir energy production and depletion processes to be represented accurately.

SUMMARY OF THE INVENTION

Briefly, the present invention provides a new and improved wells placement analysis system for a reservoir having gas condensate production from layers of a subsurface hydrocarbon reservoir. The system includes one or more processors, and one or more input/output units adapted to be in communication with the one or more processors. The system also includes one or more databases adapted to store and associate a plurality of reservoir metrics with a plurality of coordinates and reservoir metrics to thereby define one or more reservoir databases. The one or more reservoir databases are in communication with the one or more processors.

The system further includes one or more non-transitory computer-readable mediums positioned in communication with the one or more processors and having one or more computer programs stored thereon including a set of instructions. The stored instructions when executed by the one or more processors cause the one or more processors to perform a sequence of processing operations.

The processing operations include generating a plurality of assessment gas condensate wells having specified production constraints at specified locations through at least one layer of the reservoir layers, the specified locations having $X_n \times Y_n \times Z_n$ coordinates. The operations also include performing a numerical simulation of productivity in the formation layers of a selected well set. The well set takes the form of one or more of the plurality of assessment gas condensate wells.

The processing operations also include determining pseudo-pressure conditions in grid cells adjacent the selected gas condensate well set at the $X_n \times Y_n \times Z_n$ coordinates of the at least one of the layers. Non-Darcy flow conditions in the grid cells adjacent the selected gas condensate well set at the $X_n \times Y_n \times Z_n$ coordinates of the at least one of the layers are then determined, based on the determined pseudo-pressure conditions in the grid cells. The processing continues by determining a productivity index for the selected gas condensate well based on the determined pseudo-pressure conditions and non-Darcy flow conditions at the $X_n \times Y_n \times Z_n$ coordinates of the at least one of the layers.

The processing operations continue with determining a total dynamic productivity index for the at least one layer for the selected gas condensate well set over a time interval of interest, with subsequent determining of placement of the assessment gas condensate well set for the reservoir based on the determined the total dynamic productivity index for the assessment gas condensate well set. The processing operations next are generating a production analysis report for the reservoir, the production analysis report including a proposed well placement for the assessment gas condensate well set.

The present invention also provides a new and improved computer-implemented method of wells placement analysis for a reservoir having gas condensate production from layers of a subsurface hydrocarbon reservoir, The method of wells placement analysis optimizes well placement of a reservoir, and is performed in a sequence of processing steps which include generating a plurality of assessment gas condensate wells having specified production constraints at specified locations through at least one layer of the reservoir layers, with the specified locations having $X_n \times Y_n \times Z_n$ coordinates.

The processing steps also include performing a numerical simulation of productivity in the formation layers of a selected well set comprising one or more of the plurality of assessment gas condensate wells, and determining pseudo-pressure conditions in grid cells adjacent the selected gas condensate well set at the $X_n \times Y_n \times Z_n$ coordinates of the at least one of the layers. Non-Darcy flow conditions in the grid cells adjacent the selected gas condensate well set at the $X_n \times Y_n \times Z_n$ coordinates of the at least one of the layers are then determined, based on the determined pseudo-pressure conditions in the grid cells.

The processing steps further include determining a productivity index for the selected gas condensate well based on the determined pseudo-pressure conditions and non-Darcy flow conditions at the $X_n \times Y_n \times Z_n$ coordinates of the at least one of the layers, followed by determining a total dynamic productivity index for the at least one layer for the selected gas condensate well set over a time interval of interest.

The processing steps then determine placement of the assessment gas condensate well set for the reservoir based on the determined the total dynamic productivity index for the assessment gas condensate well set, and generate a production analysis report for the reservoir, the production analysis report including an proposed well placement for the assessment gas condensate well set.

DETAILED DESCRIPTION OF THE PREFERRED EMBODIMENTS

Figure 1:
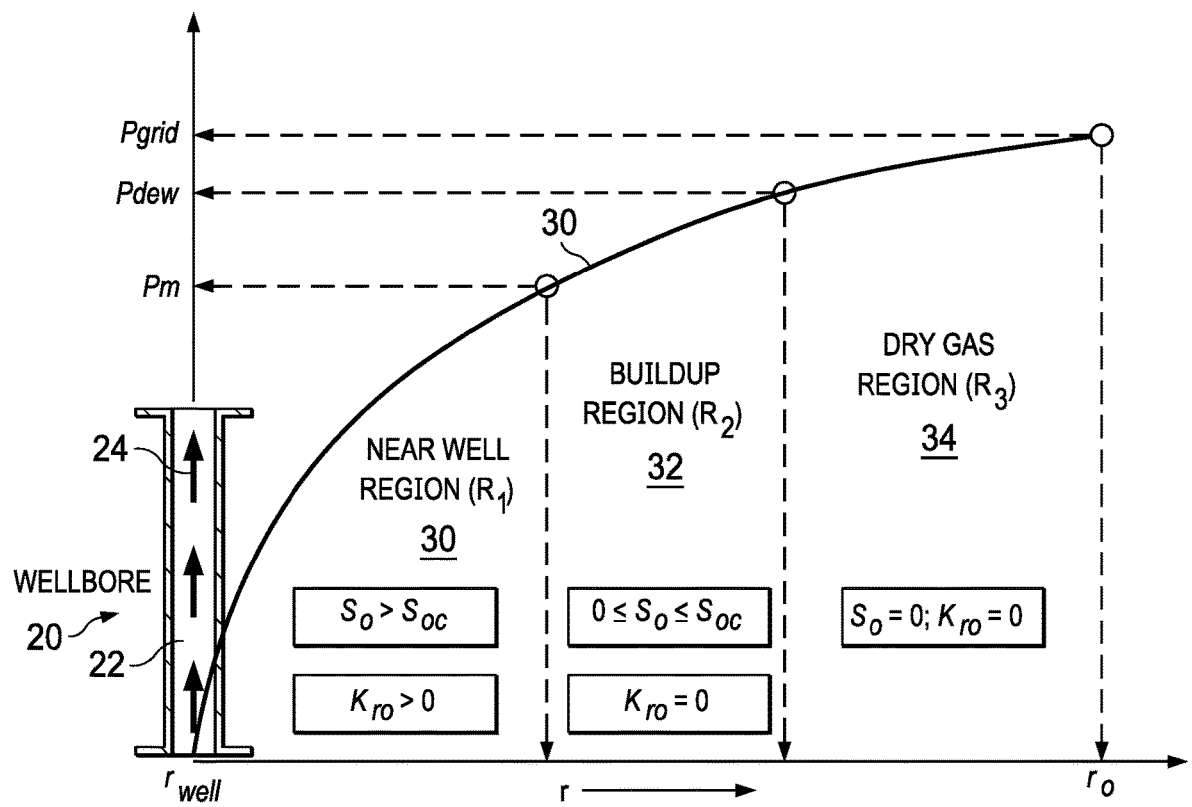
FIG. 1 is a diagram illustrating pressure conditions in a wellbore of a gas condensate well adjacent subsurface formation rock.

In the drawings, FIG. 1 illustrates schematically a wellbore 20 in a gas condensate well 22 producing both hydrocarbon and gas condensate (oil) liquid, as indicated by an arrow 24. The well 22 is typically formed extending through several layers of a subsurface reservoir to receive gas condensate production. Pressure conditions in the layer in the formation layer adjacent the wellbore 20 are indicated by a pressure curve 26 indicating formation pressure as a function of radial distance r into the formation from a longitudinal axis of the wellbore 22.

As shown in FIG. 1, the liquid or gas condensate phase of the formation production fluid accumulates in a near wellbore region 30, forming an annular region in the formation adjacent the wellbore. The near wellbore region 30 is surrounded by what is known as a buildup region 32, which is in turn within an outer region 34 known as a dry gas region. As the pressure curve 26 indicates, fluid pressures in the regions 30, 32 and 34 vary according to radial distance r from the wellbore 32, according both pressure and formation conditions.

In the near wellbore region 30, an accumulating liquid phase progressively impairs the gas deliverability from the reservoir formation. Numerical model have indicated that condensate blockage reduces deliverability of radial gas condensate well.

Well placement planning in gas reservoirs requires an accurate and efficient approach for modeling the deliverability of gas/gas-condensate wells in locations (known as sweet spots) which are likely to be more productive. Calculation of gas/gas-condensate well deliverability has been a long standing problem without a simple solution. Production data for gas-condensate wells have shown that well productivity is significantly reduced when wellbore bottom-hole-flowing-pressure (BHFP) drops below saturation pressure of the in-place reservoir fluid. This applies even for lean gas condensate reservoirs where maximum liquid drop out in a deep reservoir is as low as 1%.

Gas rate equation studies have used what is known as a pseudo-pressure integral to model condensate banking. Evaluation of pseudo-pressure integral typically required an additional computerized reservoir simulation run to determine measures of both pressures and formation fluid saturation. The pressures and saturations have more recently been determined from producing well stream composition without an additional run.

For example in a publication co-authored by one of the present inventors presented a method for evaluation of pseudo-pressure integral (replacing non-linear solution with piecewise representation of rock properties), with provision to couple with non-Darcy flow. "Efficient Modeling Of Near Wellbore Phenomena For Large Scale Gas-Condensate Systems In Massively Parallel Reservoir Simulator," *Conference Proceedings, ECMOR XVI—16th European Conference on the Mathematics of Oil Recovery*, Manzoor S., et al., 2018

In gas wells, high-pressure gradients induce high gas velocities in the near-wellbore regions. At higher velocity, in addition to the viscous force component represented by Darcy's law and equation, there is also an inertial force acting due to convective accelerations of the fluid particles. The inertial force (non-Darcy component) is negligible at low flow velocities and is generally omitted from liquid flow production determinations by reservoir simulation.

For a given pressure drawdown, however, the velocity of gas is at least an order of magnitude greater than that of oil, due to the low density and viscosity of the gas. The non-Darcy component should be included in determining the flow of gases through a porous formation medium in gas condensate wells. However, even for gas, the non-Darcy component is significant only in the restricted region of high pressure drawdown and high velocity in near well region 30, close to the wellbore. In gas-condensate reservoirs the gas flow condition is further adversely affected when liquid drop out in the near wellbore region occupies formation rock pore spaces and reduces effective flow area. Consequently, it is important to consider the additional pressure drops caused by non-Darcy flows in the near well bore region for gas-condensate reservoirs.

Numerical simulation of reservoir and wellbore fluid flow processes is typically based on a modified set of partial differential (conservation) equations, coupled dynamically. Reservoir boundary conditions come in the form of well controls that are used to match historical data and/or define operational limits for reservoir forecasting. In general, discrete grid cell size used in reservoir simulation is much larger than that of the wellbore and would introduce singularities if the well was discretized similar to that of grid cell size. A measure known as a well productivity index ($WI_l$) has been utilized to couple well production measures to the reservoir simulation results, by relating wellbore pressure and flow to the grid cell parameters. The well inflow performance relationship for a compositional case for a given phase p through layer/completion l connected to grid block i, is given by:

$$q_{c,l} = WI_l \times \lambda_{c,l} \times (p_i - p_{w,l}) \quad (1)$$

where $\lambda_{c,l}$ is the upstream hydrocarbon component molar mobility, $p_i$ is grid cell pressure, $p_{w,l}$ is the wellbore pressure incorporating gravity and friction effects for the layer l.

For producing gas condensate wells the upstream hydrocarbon component molar mobility $\lambda_{c,l}$ is the defined as:

$$\lambda_{c,l} = \left(\frac{k_{ro}\rho_o}{\mu_o}\right)_l x_c + \left(\frac{k_{rg}\rho_g}{\mu_g}\right)_l y_c \quad (2)$$

where $k_{rp}$ represents relative permeability, $\rho_p$ corresponds to molar density, and $\mu_p$ is viscosity with subscript p relating to hydrocarbon (oil/gas) phase. In Equation (2) $x_c$ and $y_c$ represent oil and gas component-mole-fraction, respectively. The reservoir parameters saturation/moles and pressure are the primary independent variables for which reservoir simulation is carried out. The other reservoir simulation variables are considered secondary/dependent variables. Mobility is a non-linear function of saturation/moles and pressure, and the mobility term ($\lambda_{c,l}$) is a non-linear function of gas condensate saturation and of pressure.

In a coupled simulator, wellbore and reservoir quantities for adjoining reservoir grid blocks and well grid blocks are synchronized dynamically in their respective grid matrices during simulation processing when passing reservoir simulation parameter information from the wellbore model to the reservoir model and vice-versa. In general, molar mobility $\lambda_{c,l}$ is determined in computerized matrix equation format in the computer 400 using upstream grid block quantities (i.e., grid block pressure and saturations). In the past, so far as is known, the molar mobility determination has been made without resolving wellbore pressure and flow dependence or interrelation.

According to the present invention, it has been found that ignoring pressure and flow dependence of fluid and rock properties leads to over/under prediction of field performance in reservoir simulation determinations for well placement. Pressure gradients or condensate saturation gradients, or both of them, are very high in the near wellbore region. This causes non-linearity of these measures in the near wellbore region. Accordingly, as will be described, with the present invention, determination of the pseudo-pressure integral, and the modelling of non-Darcy flow effects, is performed in a manner resolving pressure and velocity dependence of rock and fluid properties in the near wellbore regions.

Pseudo-Pressure

In order to improve the accuracy of gas-condensate well inflow modelling without increasing the grid resolution, a pseudo-pressure method is commonly used. The pseudo-pressure method computes the relation between molar or volumetric flow rate from a well grid block and the local wellbore pressure. The pseudo-pressure methodology replaces the traditional single point upstream well mobility (Equation (2)) with an integrated form that more accurately predicts condensate banking in the high drawdown regimes around the wellbore 22 independent of the geometry of well 20. Pseudo-pressure calculations are based on dividing the area around the well into three flow regions or regimes 30, 32 and 34 as shown in FIG. 1. Flow regimes in the regions 30, 32 and 34 are based on an assumption that initially a small condensate bank is formed which is entirely below a critical saturation $S_{OC}$. Farther away from the producing gas condensate wellbore 20, saturation S of the condensate in formation regions around the well 20 decreases and reaches the critical saturation $S_{oc}$ at a maximum liquid drop out pressure $p_m$ in transition zone 32 exhibiting decreasing condensate saturation. Eventually when reservoir pressure reaches a pressure $p_{dew}$ corresponding to maximum liquid drop out, the transition zone ends at dry gas region 34 with no liquid condensate saturation in the reservoir 34.

In the first or near well region 30, where formation parameters can be expressed as ($S_o$, $k_{ro}$, $k_{rg}$>0), the flow of gas is reduced due to mobile oil. Similarly in the second or build-up region 32, where formation parameters can be expressed as ($S_o$, $k_{rg}$>0 and $k_{ro}$=0), the gas flow is also reduced due to presence of immobile oil of the gas condensate. However, in the third or dry gas region 34, the reservoir pressure is such that no oil phase is present, since (p>$p_d$) and only dry gas is present and flowing. The composition of the well-stream mixture stays unchanged in both in near well region 30 and in dry gas region 34. However, in build-up region 32 the gas condensate liquid composite changes due to the presence of immobile condensate in the formation. Numerical modelling by the pseudo-pressure method for near well region 30 and in dry gas region 34 is carried out by what is known as the constant-composition-expansion (CCE). Numerical modelling by the pseudo-pressure method for build-up region 32 is performed by what is known as a constant-volume-depletion (CVD) experiment method.

Non-Darcy Flow Effects

The pressure drop due to non-Darcy component is usually described by the Forchheimer equation, in which the deviation from the Darcy's law is proportional to an inertial resistance factor, expressed as what is known as a beta-factor. The beta factor is regarded as a property of porous media, and can be modeled as rate dependent blockage skin in the well inflow performance relationship.

However, instead of rewriting appropriate part of well-model, in a manner similar to pseudo-pressure, pressure drop caused by the non-Darcy component can be equivalently modelled as completion flow blocking factor given by:

$$FB_2 = \frac{G_l}{G_l + D_l |q_{fg,l}|} \quad (3)$$

where $D_l$ represents connection/perforation non-Darcy D-factor and $q_{fg,l}$ is the free gas flow rate at surface conditions. In Equation (3) G is geometric factor defined as $G=\ln(r_o/r_w)+s$, with $r_w$ and $r_o$ being wellbore and pressure equivalent block radius and s corresponds to user defined skin. The non-Darcy D-factor in wells is usually determined by analysis of multi-rate pressure results, but such data is not available in many cases. Alternatively, correlations obtained from literature can be employed to obtain connections D-factors. Such correlation are calculated based on the permeability and porosity of the connected grid block, together with the fluid properties of the wellbore gas. Calculation of non-Darcy flow blockage factor does not require additional vapor liquid equilibration (VLE) processes, instead can be co-computed with pseudo-pressure integral.

Figure 2:
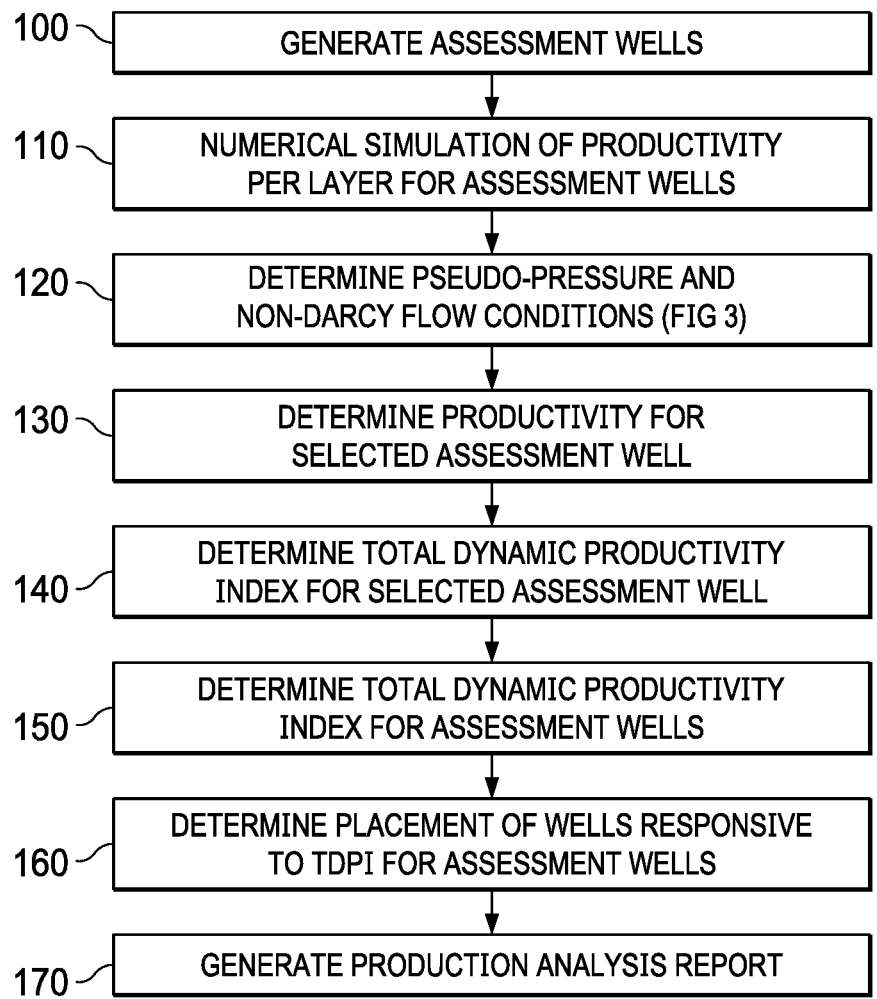
FIG. 2 is a workflow of processing by a wells placement analysis system according to the present invention.

FIG. 2 is a high level schematic diagram of a workflow W of the methodology of the wells placement analysis system according to the present invention. As will be described, the wells placement system operating to the workflow W quantifies well productivity and near wellbore flow conditions in gas condensate wells of subsurface hydrocarbon reservoirs.

As indicated at 100, processing begins with generating a plurality of potential or simulated assessment gas condensate wells having specified production constraints at specified locations through at least one layer of the reservoir layers, the specified locations having $X_n \times Y_n \times Z_n$ coordinates. The assessment wells are generated during step 100 to the user specified point constraints to evaluate the reservoir productivity and energy of gas condensate at those particular locations.

Figure 13:
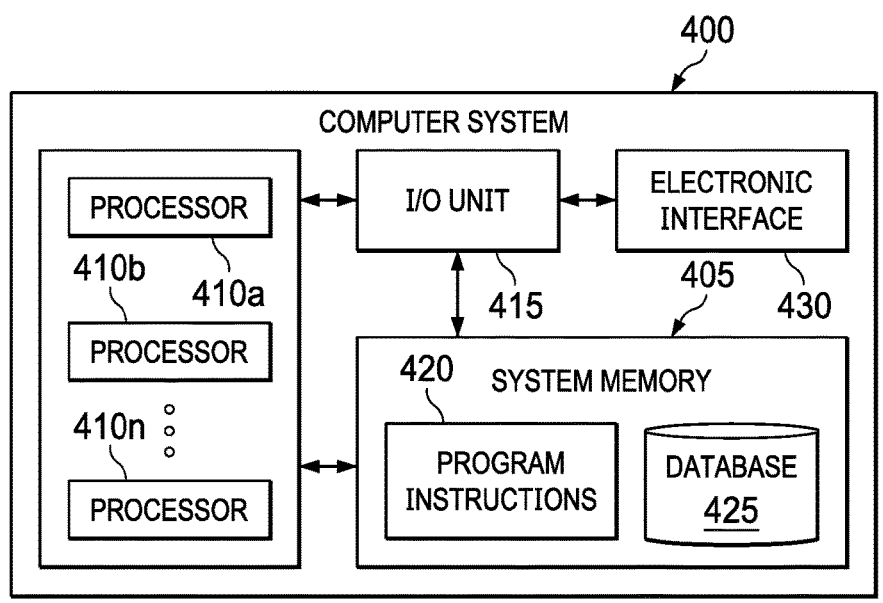
FIG. 13 is a schematic block diagram illustrating an example computer for the wells placement analysis system according to the present invention.

As indicated at 110, numerical simulation of productivity per layer for assessment wells is then performed in a computer or data processing system 400 shown in FIG. 13. The numerical simulation during step 110 determines productivity in the formation layers of a selected well set comprising one or more of the plurality of assessment gas condensate wells, such as wellbore 20. In the disclosed embodiment, a reservoir simulator of Saudi Arabian Oil Company known as GigaPOWERS™ is a suitable reservoir simulator used to perform the assessment case examples which are described. It should be understood that other reservoir simulation methodologies may also be used for such numerical simulation.

Step 120 is then performed in the computer 400 to determine pseudo-pressure and non-Darcy flow conditions in the manner described. The determination of pseudo-pressure conditions and non-Darcy flow conditions during step 120 is performed for grid cells adjacent the selected gas condensate well set at the $X_n \times Y_n \times Z_n$ coordinates of at least one of the layers of the reservoir.

Figure 3:
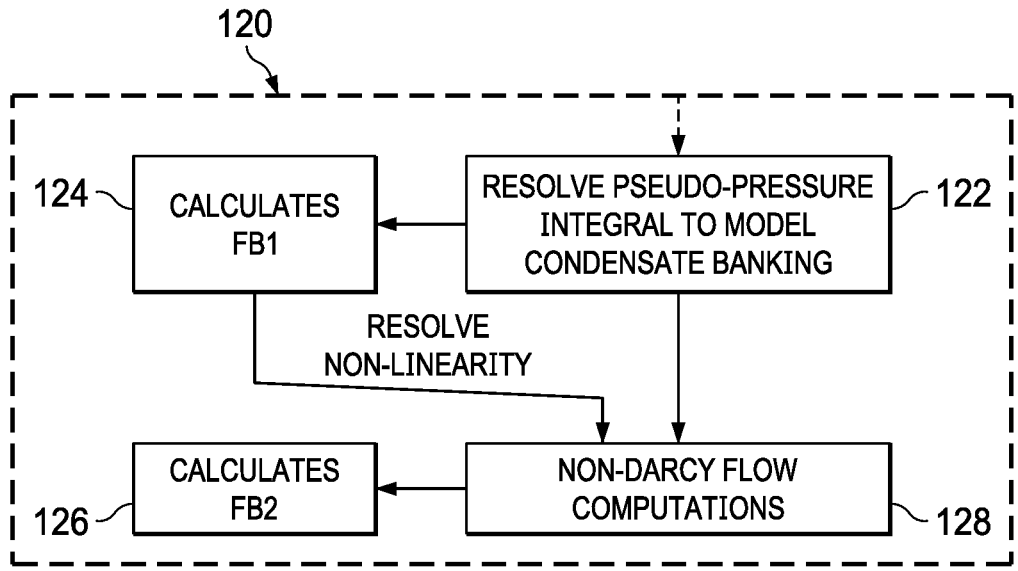
FIG. 3 is a more detailed workflow of a portion of the processing of FIG. 2.

FIG. 3 illustrates in more detail the processing during step 120 which begins with step 122 which is performed to resolve the pseudo-pressure integral to model condensate banking according to the present invention. During step 122, the pseudo-pressure integral is determined in the manner described with numerical modelling according to the constant-volume-depletion (CVD) method as has been described.

Step 122 is performed by to determine or calculate a pseudo-pressure flow blockage factor $FB_1$. The pseudo-pressure flow blockage factor $FB_1$ is expressed as:

$$FB_1 = \frac{1}{\lambda_{T,l}(p_i)} \frac{1}{(p_i - p_{w,l})} \lambda_{T,l} dp \quad (4)$$

where $\lambda_{T,l}$ is the hydrocarbon phase molar mobility, $p_i$ is grid cell pressure, and $p_{w,l}$ is the wellbore pressure condition incorporating gravity and friction effects for the layer l.

According to the present invention, the pseudo-pressure flow blockage factor $FB_1$ resulting from step 122 is then used as a set value as indicated at step 124 for subsequent processing during step determination 126.

Each pseudo-pressure and near wellbore non-Darcy flow modelling options computes flow blockage factors, accounting for condensate banking and rate dependent skin (turbulence) respectively. In a simulation using both pseudo-pressure and non-Darcy flow modelling options, it has been found according to the present invention that it is necessary that the order in which these modeling options are performed must be in a specific sequence. Further with the present invention it has been found that this sequence is necessary in determining a total blockage factor, since the pseudo-pressure blockage factor and the non-Darcy flow blockage factor cannot simply be linearly added. As displayed in FIG. 3, the present invention provides a sequential method, whereby first during step 122, the pseudo-pressure integral is resolved during step 124 for determination of $FB_1$, according to Equation (4). This is followed by non-Darcy flow modelling during step 126, followed by determination of the non-Darcy flow blockage factor $FB_2$ during step 128.

When performing the non-Darcy flow computation during step 126, the determined pseudo-pressure blocking factor $FB_1$ is embedded inside Equation (3) as has been set forth. In Equation (3), the term $q_{fg,l}$ represents the free gas flow rate, and is given by:

$$q_{fg,l} = FB_1 \times WI_l \times \lambda_{gas,l} \times fvf_g \times (p_i - p_{w,l})$$

It is also to be noted that the present invention also resolves circular dependency between pseudo-pressure and non-Darcy flow modelling options. This is accomplished because the determined pseudo-pressure blockage factor $FB_1$ is included in the $q_{fg,l}$ expression for determining the non-Darcy flow blockage factor $FB_2$. The total blockage factor FB applied to gaseous phase is then given by:

$$FB = FB_1 \times FB_2$$

The pseudo-pressure flow blockage factor $FB_1$ determined during step 124 is then provided to resolve non-linearity as indicated schematically in FIG. 3 for non-Darcy flow computations during step 126 in the manner already described. Step 128 is then performed to determine the completion blocking factor $FB_2$ according to Equation (3) in the manner described.

Figure 6:
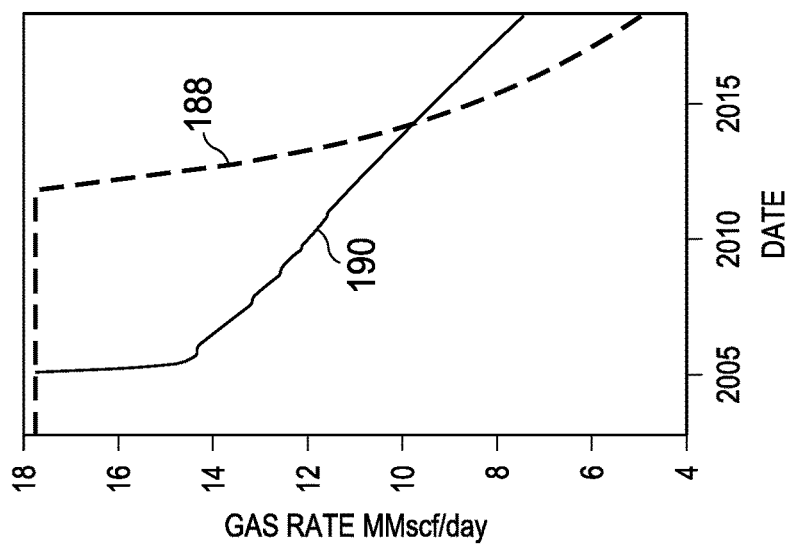
FIG. 6 is an example display of simulation results obtained according to the present invention and illustrating the effect of condensate banking on gas rate in a gas condensate well.
Figure 5:
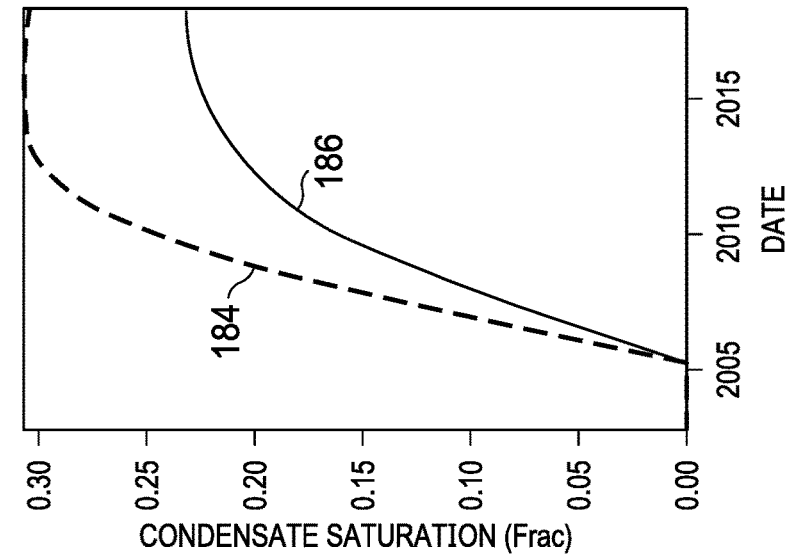
FIG. 5 is an example display of simulation results obtained according to the present invention and illustrating the effect of condensate banking on condensate saturation near a gas condensate well.
Figure 4:
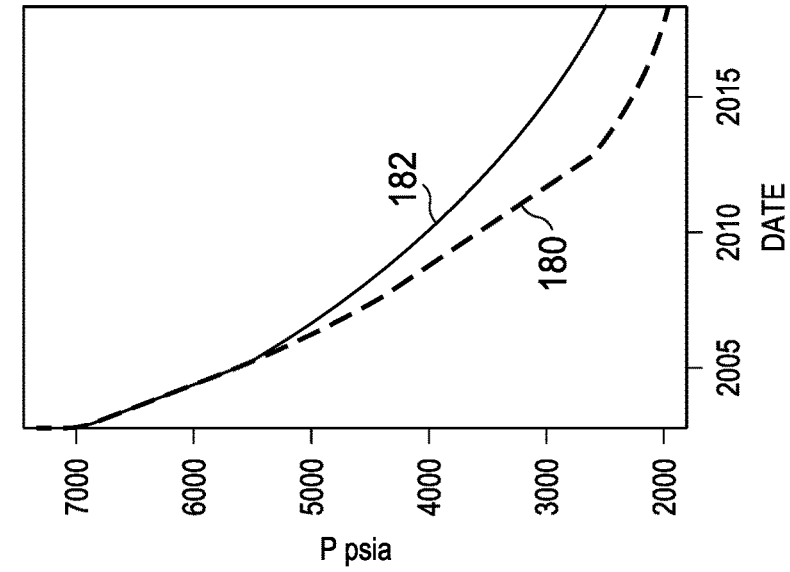
FIG. 4 is an example display of simulation results obtained according to the present invention and illustrating the effect of condensate banking on well pressure in a gas condensate well.

FIGS. 4, 5 and 6 are example displays of simulation results obtained according to the present invention and illustrating the effect of condensate banking on simulations results of the type. FIGS. 4, 5 and 6 are obtained for well placement according to the present invention. FIG. 4 is a display of well pressure showing at 180 results of well pressure simulation with prior art techniques. Well pressure simulation based on determination of pseudo-pressure integral, with mobility non-linearities resolved according to the present invention is shown at 182.

It can be observed from FIG. 4 that when pressure drops below dew point pressure of the fluid in place, the pressures indicated by processing according to the present invention are higher over the time interval for which reservoir simulation is performed.

FIG. 5 is a display of condensate saturation as a fractional value of produced gas, showing at 184 results of condensate saturation simulation in a near wellbore region with prior art techniques. Condensate saturation simulation based on determination of pseudo-pressure integral, with mobility non-linearities resolved according to the present invention is shown at 186. It can be observed from FIG. 5 that condensate in the produced gas starts to build up, as indicated at 186. Due to such an accumulation of condensate in the near wellbore region, relative permeability of the free gas of the formation layer is greatly reduced.

FIG. 6 is a display of gas rate or well productivity from a well, showing at 188 results of well gas rate simulation in comparison with prior art techniques. Gas rate saturation simulation based on determination of the pseudo-pressure flow blockage factor, with mobility non-linearities resolved according to the present invention is shown at 190.

It can be seen from FIG. 6, that well productivity results begin to decrease at a much earlier time. Further, FIG. 6 illustrates that, over the time interval for which reservoir simulation is performed, well productivity results are drastically reduced. In addition, as has been noted in relation to FIG. 4, well performance is predicted according to previous methods, since condensate banking effects have not been modeled. During step 130, a productivity index is determined for the selected gas condensate well or wells of the set based on the determined pseudo-pressure conditions and non-Darcy flow conditions with the non-linearity resolved. The productivity index is determined for the selected assessment gas condensate well or wells of the set during step 130 at the $X_n \times Y_n \times Z_n$ coordinates of the layers indicated. For the productivity computation during step 130, matrix equations and wellbore equations are solved by reservoir simulation.

Step 140 is then performed to determine total dynamic productivity for determining a total dynamic productivity index for the selected assessment gas condensate well or wells of the set over a time interval of interest. The total dynamic productivity index values during step 140 represents the amount of hydrocarbon volume that may be drained from a well drilled at a certain spot when the reservoir pressure is decreased by one unit with no time restriction. As indicated at step 150, a total dynamic productivity index determination is performed for each of the selected sets of assessment wells in the reservoir at their respective $X_n \times Y_n \times Z_n$ coordinates in the reservoir. The total dynamic productivity index values determined during step 150 represents the amount of hydrocarbon volume that may be drained from each of the selected sets of assessment wells drilled at their respective coordinates when the reservoir pressure is decreased by one unit with no time restriction.

Step 160 is then performed to determine placement of wells responsive to total dynamic productivity index determined for the assessment wells designated during step 100. A wells placement optimization algorithm is performed during step 160 using the total dynamic productivity index to determine optimum placement of wells for a reservoir. The wells placement optimization algorithm during step 160 preferably uses the formulas for determining optimum wells placements as described in previously referenced co-pending U.S. patent applications Ser. Nos. 15/807,976 and 14/330,324, which are incorporated herein by reference for all purposes.

The wells placement analysis results of step 160 are then the basis for generating a production analysis report during step 170 for determining placement of the assessment gas condensate well set for the reservoir. The production analysis report for the reservoir generated during step 170 provides a proposed well placement for the assessment gas condensate wells of the reservoir.

Figure 7:
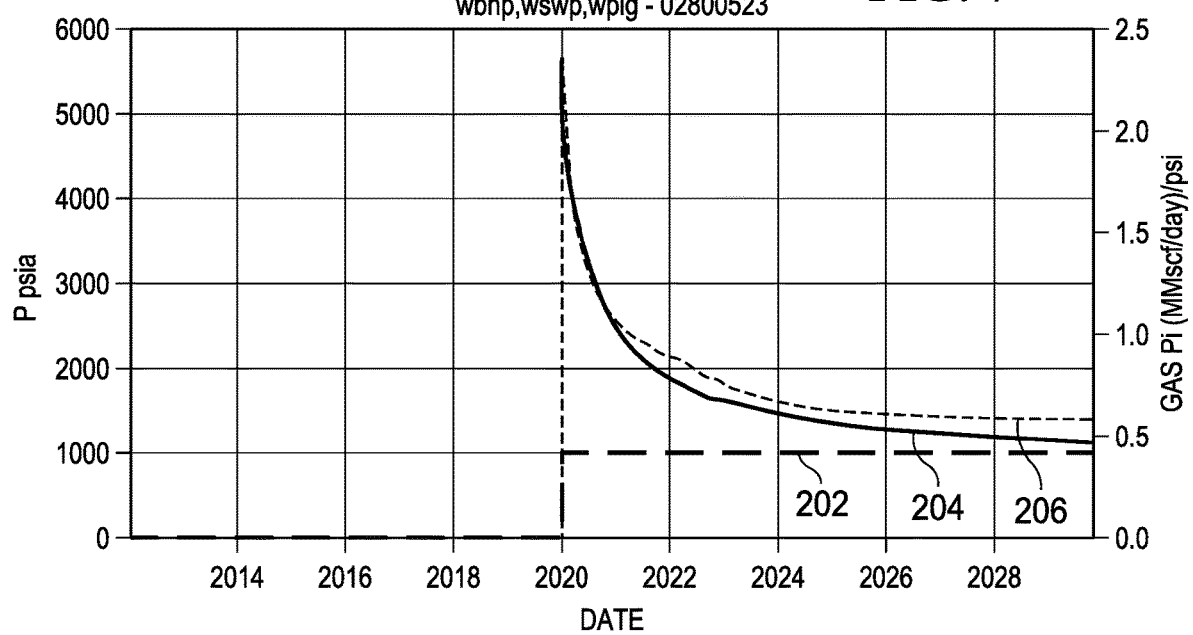
FIGS. 7, 8, 9 and 10 are example displays from reservoir simulation processing according to the present invention illustrating the effect of near wellbore formation gas condensate well flow on pressure conditions and well productivity.

FIG. 7 is a plot of simulated values of pressures in absolute pounds per square inch (psia) and gas productivity index in millions of standard cubic feet per day (Mscf/day) for well bottom hole pressure (wbhp) as indicated at 202; static well pressure (wswp) 204; and well gas productivity index (wpig) 206 at selected times from a computerized reservoir simulation. The simulation was performed with regular Darcy flow computations at selected times for the reservoir simulation and with no pseudo-pressure blockage factor taken into account.

Figure 8:
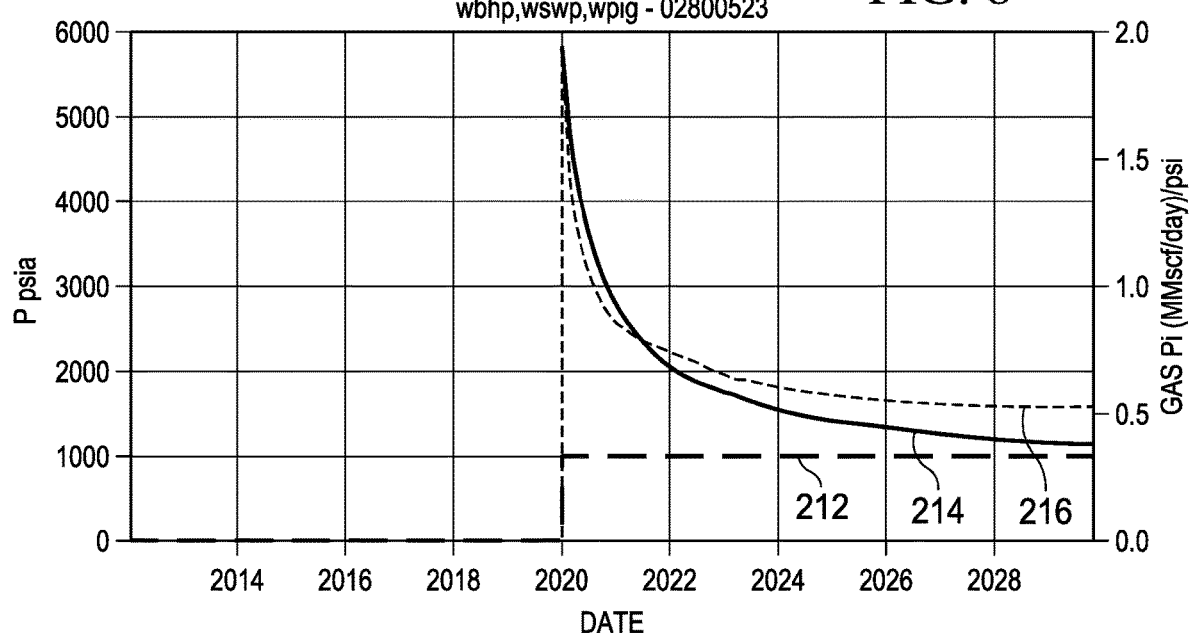

FIG. 8 is a plot of simulated values of pressures of well bottom hole pressure (wbhp) as indicated at 212; static well pressure (wswp) 214; and well gas productivity index (wpig) 216 at selected times from a computerized reservoir simulation when a pseudo-pressure functionality is activated. FIG. 8 shows the impact on well pressure and gas productivity determinations during computerized reservoir simulation of the same gas well, as that of FIG. 7, when a pseudo-pressure functionality is activated. It can be seen that pseudo-pressure blockage factor considerations alone made a slight difference in pressure computations and thus lowered productivity index values in comparison to the conventional case in FIG. 7.

Figure 9:
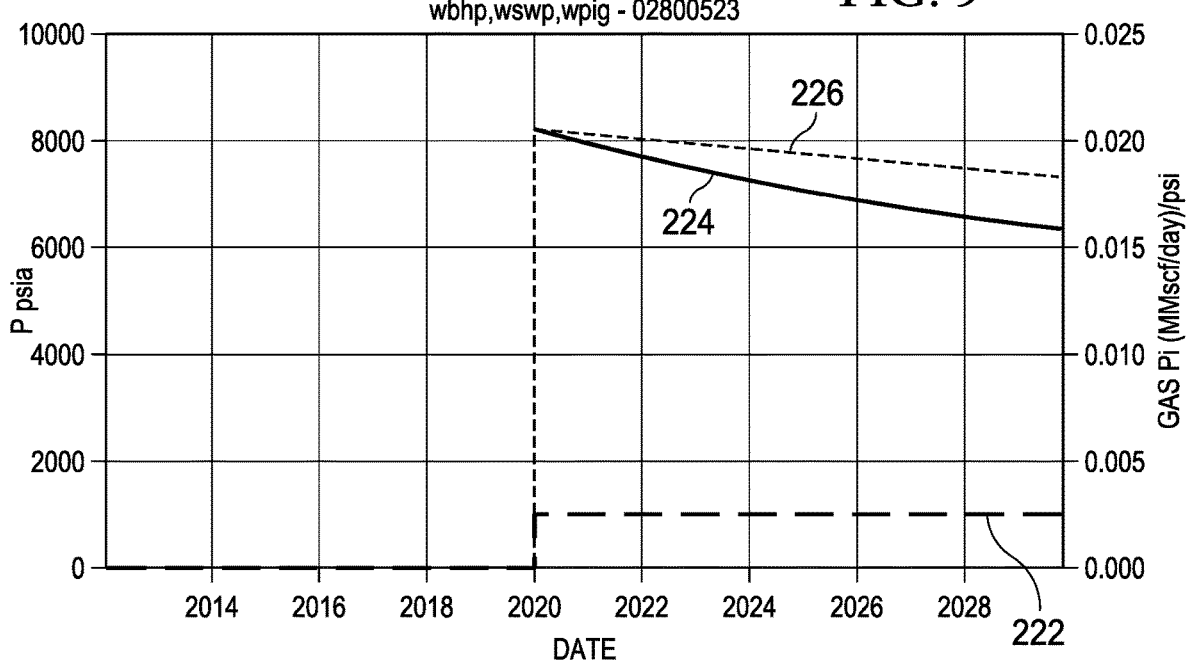

FIG. 9 is a plot of simulated values of pressures of well bottom hole pressure (wbhp) as indicated at 222; static well pressure (wswp) 224; and well gas productivity index (wpig) 226 at selected times from a computerized reservoir simulation when the influence of non-Darcy flow is taken into account during the simulation. As indicated at 226, gas productivity is substantially constant from the initial simulation time throughout the simulation. FIG. 9 illustrates how non-Darcy flow in the gas condensate being simulated adversely chokes gas condensate well productivity when a large value of D factor is used to compute non-Darcy flow component.

Figure 10:
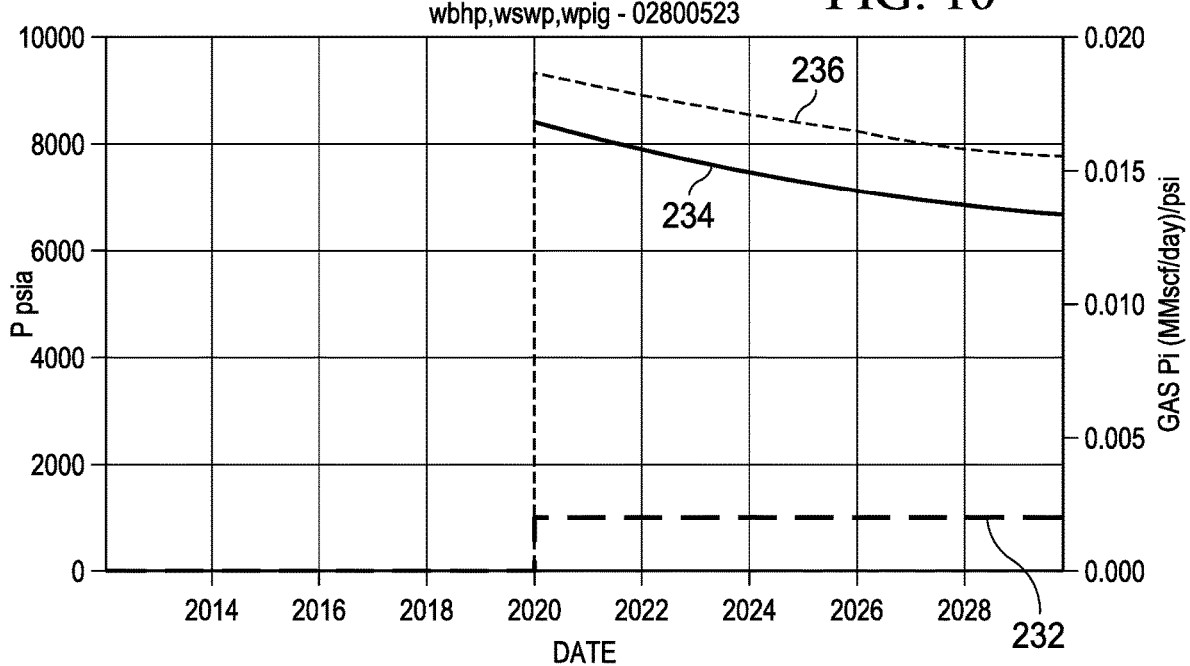

FIG. 10 is a plot of is a plot of simulated values of pressures of well bottom hole pressure (wbhp) as indicated at 232; static well pressure (wswp) 234; and well gas productivity index (wpig) 236 at selected times from a computerized reservoir simulation when the influence of both a pseudo-pressure function and non-Darcy flow are each separately taken into account during the simulation. FIG. 10 thus shows the effect of pseudo-pressure function and non-Darcy flow contribution administered independently on both the productivity and deliverability of the gas well.

Figure 11:
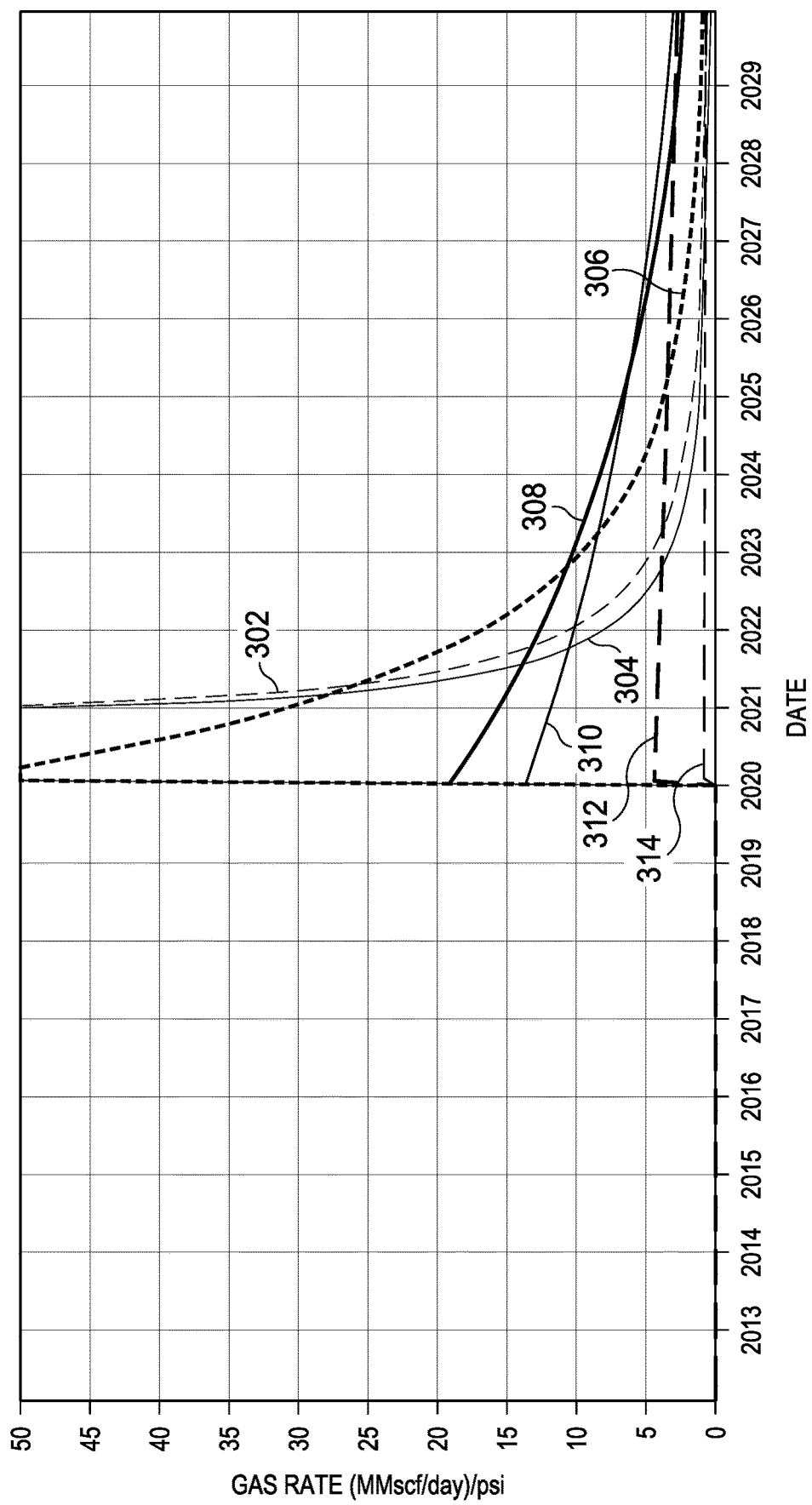
FIGS. 11 and 12 are example displays of gas rate flow from a gas condensate well illustrating the effect of non-Darcy flow conditions on from the well.

FIG. 11 is a plot of gas rates at selected times from a computerized reservoir simulation for selected values of non-Darcy flow D-factor is taken into account. Indicated at 302 is a gas rate based on a pseudo-pressure function with conventional Darcy flow computations. The other gas rates display are for selected values of a non-Darcy flow D-factor taken into account. These gas rates were obtained by considering the effects of non-Darcy flow computations and pseudo-pressure function as separate and unrelated factors.

Thus, at 302 gas rate with conventional Darcy flow and with pseudo-pressure function activated is shown. At 304, gas rate for conventional Darcy flow with no pseudo-pressure computation is indicated.

The gas rate plotted at 306 is for a case involving non-Darcy flow computation with a D factor value of 0.005 and with no pseudo-pressure computation. The gas rate plotted at 308 indicates results for the case involving non-Darcy flow computation with a D factor value of 0.05 with no pseudo-pressure function. The gas rate plotted at 310 indicates results for a case involving non-Darcy flow computation with a D factor value of 0.1, with no pseudo-pressure function. The gas rate plotted at 312 indicates results for a case involving non-Darcy flow computation with D factor value of 1.0 with no pseudo-pressure function. The gas rate plotted at 314 indicates results for a case involving non-Darcy flow computation with D factor value of 32, and with no pseudo-pressure function. The gas rates plotted in FIG. 11 demonstrate that as the non-Darcy flow D factor value increases the impact on productivity becomes more severe.

Figure 12:
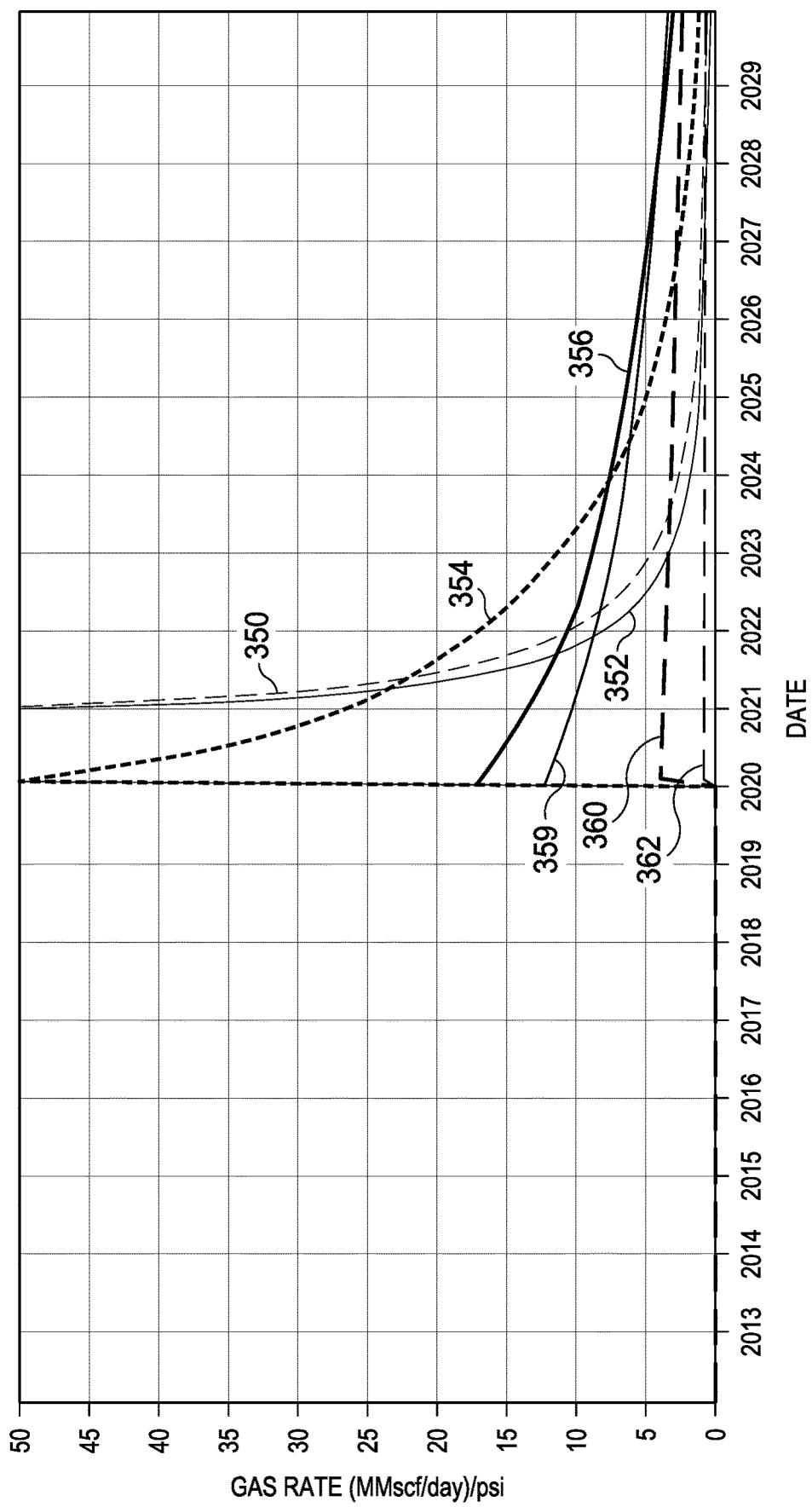

FIG. 12 is another plot of gas rates at selected times from a computerized reservoir simulation for selected values of non-Darcy flow D-factor is taken into account, both with and without a pseudo-pressure function. However, in contrast to the gas rates in FIG. 8, the gas rates for selected values of non-Darcy flow D-factor with a pseudo-pressure function taken into account are obtained with the non-linearity of condensate saturation and pressure being taken into account according to the present invention.

At 350 in FIG. 9, gas rates for conventional Darcy flow with pseudo-pressure function activated are indicated. Gas rate simulation results plotted at 352 are for conventional Darcy flow with no pseudo-pressure computation. Gas rate results 354 are for a case involving non-Darcy flow computation with a D factor value of 0.005, and with pseudo-pressure computation. Gas rate results 356 are for a case involving non-Darcy flow computation with D factor value of 0.05 with pseudo-pressure function taken into account. Gas rate results 358 were obtained for a case involving non-Darcy flow computation with a D factor value of 0.1, and with pseudo-pressure function considered. Gas rate results 360 are for a case involving non-Darcy flow computation with D factor value of 1.0 with pseudo-pressure function taken into account. Gas rate results 362 are for a case involving non-Darcy flow computation with a D factor value of 32, again with pseudo-pressure function taken into account. It is again to be noted that as the D factor value increases the impact on productivity becomes more severe. However, in contrast to the gas rate results of FIG. 11, FIG. 12 is an example of the impact of the non-Darcy flow and the pseudo-pressure function, while taking into account the non-linearity of condensate saturation and pressure according to the present invention, further restricts simulated or estimated measures of gas condensate well productivity.

As illustrated by using an example in FIG. 13, the methods of determining an optimum placement of wells in a reservoir can be driven by the computer 400 that can include, according to various exemplary embodiments of the present invention, at least a memory 405, a processor 410, and an input/output (I/O) device 415. As used herein, the processor 410 can include, for example, one or more microprocessors, microcontrollers, and other analog or digital circuit components configured to perform the functions described herein. The processor is the "brain" of the respective computer, and as such, can execute one or more computer program product or products. For example, the processor in the reservoir analysis system can execute a computer program product or instructions 420 stored in memory 405 of the computer 400, including, for example, a product to facilitate the generation of a reservoir analysis report. Such a product can include a set of instructions to display with an electronic interface 430 of computer 400 or at a remote computer that allows a user to input reservoir metrics of a selected reservoir. Such a product can also include instructions 420 to calculate productivity indexes during step 130 for a selected assessment well or well set responsive to the reservoir metrics: to calculate during steps 140 and 150 the total dynamic productivity indexes; to determine during step 160 an optimal wells placement for a reservoir. The instructions 420 also cause the computer 400 to generate reservoir analysis reports during step 170.

The processor 400 can be any suitable commercially available terminal processor, or plurality of terminal processors, adapted for use in or with the computer 400. A processor may be any suitable processor capable of executing/performing instructions. A processor may include a central processing unit (CPU) that carries out program instructions to perform the basic arithmetical, logical, and input/output operations of the computer 400. The processor 400 also includes code (e.g., processor firmware, a protocol stack, a database management system, an operating system, or a combination thereof) that creates an execution environment for program instructions.

The processor 400 may include general and/or special purpose microprocessors 410a, 410b . . . 410n. The processor can be, for example, the Intel® Xeon® multicore terminal processors, Intel® micro-architecture Nehalem, and AMD Opteron™ multicore terminal processors, Intel® Core® multicore processors, Intel® Core iSeries® multicore processors, and other processors with single or multiple cores as is known and understood by those skilled in the art. The processor 400 can be operated by operating system software installed on memory, such as Windows Vista, Windows NT, Windows XP, UNIX or UNIX-like family of systems, including BSD and GNU/Linux, and Mac OS X. The processor can also be, for example the TI OMAP 3430, Arm Cortex A8, Samsung S5PC100, or Apple A4. The operating system for the processor can further be, for example, the Symbian OS, Apple iOS, Blackberry OS, Android, Microsoft Windows CE, Microsoft Phone 7, or PalmOS. Computer system 400 may be a processor system including one processor (e.g., processor 410a), or a multi-processor system including any number of suitable processors (e.g., 410a-410n). Multiple processors of this type may be employed to provide for parallel and/or sequential execution of one or more portions of the techniques described herein. Processes and logic flows described herein may be performed by one or more programmable processors executing one or more computer programs to perform functions by operating on input data and generating corresponding output. Processes and logic flows described herein may be performed by, and apparatus can also be implemented as, special purpose logic circuitry, e.g., an FPGA (field programmable gate array) or an ASIC (application specific integrated circuit). Computer system 400 may include a computer system employing a plurality of computer systems (e.g., distributed computer systems) to implement various processing functions.

The computer 400 as illustrated in the example described in FIG. 13 can further include a non-transitory memory or more than one non-transitory memories (referred to as memory 405 herein). Memory 405 can be configured, for example, to store data, including computer program product or products, which include instructions 420 for execution on the processor 410. Memory 405 can include, for example, both non-volatile memory, e.g., hard disks, flash memory, optical disks, and the like, and volatile memory, e.g., SRAM, DRAM, and SDRAM as required to support embodiments of the instant invention. As one skilled in the art will appreciate, though the memory 405 is depicted on, e.g., a motherboard, of the computer 400, the memory 405 can also be a separate component or device, e.g., flash memory, connected to the computer 400 through an input/output unit or a transceiver. As one skilled in the art will understand, the program product or products, along with one or more databases, data libraries, data tables, data fields, or other data records can be stored either in memory 405 or in separate memory (also non-transitory), for example, associated with a storage medium such as a database (not pictured) locally accessible to the computer 400, positioned in communication with the computer 400 through the I/O device 415. Non-transitory memory 405 further can include drivers, modules, libraries, or engines allowing the reservoir analysis computer to function as a dedicated software/hardware system (i.e., a software service running on a dedicated computer) such as an application server, web server, database server, file server, home server, standalone server. For example, non-transitory memory can include a server-side markup language processor (e.g., a PHP processor) to interpret server-side markup language and generate dynamic web content (e.g., a web page document) to serve to client devices over a communications network.

Exemplary embodiments of the present invention include a reservoir analysis interface. A reservoir analysis interface is, for example, a graphical user interface facilitating the acquisition of data from the user to determine the impact of reservoir metrics on wells placement optimization. This electronic interface can also display the reservoir analysis report. The graphical user interface device can include, for example, a CRT monitor, a LCD monitor, a LED monitor, a plasma monitor, an OLED screen, a television, a DLP monitor, a video projection, a three-dimensional projection, a holograph, a touch screen, or any other type of user interface which allows a user to interact with one of the plurality of remote computers using images as is known and understood by those skilled in the art.

According to various exemplary embodiments of the present invention, the reservoir analysis report computer can be a server and can include, for example, any type of mainframe, physical appliance, or personal computing device such as rack server, mainframe, desktop computer, or laptop computer, dedicated in whole or in part to running one or more services to serve the needs or requests of client programs which may or may not be running on the same computer. The reservoir analysis computer can be, for example, a dedicated software/hardware system (i.e., a software service running on a dedicated computer) such as an application server, web server, database server, file server, home server, or standalone server. As one skilled in the art will appreciate, though the reservoir analysis computer can interface with a separate web server, application server, or network server to access the functionality of the reservoir analysis computer, for example, through a communications network or other network options, and such a configuration may be preferred for certain large-scale implementations.

As one skilled in the art will understand, the program product or products, along with one or more databases, data libraries, data tables, data fields, or other data records can be stored either in non-transitory memory or in separate memory (also non-transitory), for example, associated with a storage medium such as database, positioned in communication with the reservoir analysis computer through the I/O devices. Non-transitory memory can further include drivers, modules, libraries, or engines allowing the reservoir analysis computer to function as a dedicated software/hardware system (i.e., a software service running on a dedicated computer) such as an application server, web server, database server, file server, home server, standalone server.

As one skilled in the art will appreciate, both memory and the processor can also include, for example, components (e.g., drivers, libraries, and supporting hardware connections) that allow the computers to be connected to a display peripheral device and an input peripheral device that allow a user direct access to the processor and the memory. The display peripheral device can be, for example, a computer monitor, which may also be known in the art as a display or a visual display unit.

The input peripheral device 415 can be, for example, a computer keyboard, computer mouse, a touch screen (such as a touch screen device comprising display peripheral device), a pen device, character recognition device, voice recognition device, or a similar input device that will be known to those having skill in the art that allows the user at the remote computer to send discrete or continuous signals to the processor. A status or other output associated with input peripheral device can be displayed at the display peripheral device, such as, for example, mouse pointer or a keyboard prompt.

It is important to note that while embodiments of the present invention have been described in the context of a fully functional system, those skilled in the art will appreciate that the mechanism of at least portions of the present invention or aspects thereof are capable of being distributed in the form of a computer-readable program product stored in a tangible computer medium and a computer-readable medium of instructions in a variety of forms for execution on a processor, processors, or the like, and that the present invention applies equally regardless of the particular type of signal-bearing media used to actually carry out the distribution. Note, the computer readable program product can be in the form of microcode, programs, routines, and symbolic languages that provide a specific set or sets of ordered operations that control the functioning of the hardware and direct its operation, as known and understood by those skilled in the art. Examples of computer readable media include, but are not limited to: nonvolatile hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, flash drives, memory sticks, HD-DVDs, mini disks, laser disks, Blu-ray disks, and other newer types of memories, and transmission type media such as digital and analog communication links.

The present invention provides several benefits and advantages. The developed [indicators of productivity are based on dynamic parameters that take into account fluid and rock properties of gas condensate wells with non-linearly interrelated fluid pressure and condensate saturation as they change with time. This is based on use of static and dynamic reservoir parameters in the process of identifying sweet spots. To optimize well placement, static parameters utilization alone have been found to be insufficient, since reservoir conditions are dynamic once gas condensate wells start producing.

Drilling inefficient hydrocarbon wells can cost the company millions of dollars every year. For gas reservoirs, the cost is more to drill and place gas wells when compared to oil wells. Therefore, it is imperative that a robust system is required and necessary to make sure that every drilled well is justified with robust sweet spots system that provide energetic view and understanding about every layer in the reservoir. This will help reservoir engineers to prioritize locations for new wells and sidetracks. It will help them as well to contrast and rank different fields performance and establish compare and rank list for fields to be developed economically. It will aid as well in knowing which areas in the reservoir that require attention whether related to poor performance or lack of data.

Considering non-Darcy flow and computing PI using pseudo-pressure functions can provide paramount answers to where to develop a particular reservoir, which can result in optimum placement of wells in gas reservoirs. This can reduce the number of inefficient wells if the right parameters revealing reservoir energy are used in the process to place new wells and/or sidetrack existing ones.

With the present invention, it has been found that prior art gas condensate well productivity determinations may be inaccurate. This may cause misinformed decisions since prior art reservoir simulation models would lacking the effect of non-linearity of pressure and condensate saturation conditions on pseudo-pressure function and non-Darcy flow computations. Decisions related to placing new wells or sidetracking existing wells in gas reservoirs are expensive decisions. A single gas well may cost an average amount of about ten million dollars. This cost can be multiplied if field development is needed with tens or hundreds of wells being considered. Therefore, placing wells in the right spots in gas reservoirs should include detailed phenomenon such as pseudo-pressure function and non-Darcy flow computations to make sure that wells placement are justified which will ensure effective production and increase the success rate of drilled or sidetracked wells in gas reservoirs.

From the foregoing, it can be appreciated that the present invention is integrated into a practical application. The present invention solves a technological problem. The previously utilized gas productivity measures for gas condensate wells used for optimized placement of wells in reservoirs indicators have not realized that condensate saturation and pressure in gas condensate wells are not static or fixed values. With the present invention, more accurate gas productivity measures are obtained, based on dynamic condensate saturation and pressure parameters that combine fluid and rock properties with pressure and condensate saturation as they change with time during production from gas condensate wells. Non-Darcy flow and blockage coefficient for gas condensate are factored into the computations of a well productivity index. The present invention highlights changes occurring during gas condensate well production due to gas expansion and non-Darcy flow effects on the productivity of gas condensate wells. The present invention takes into account dynamic reservoir parameters when identifying sweet spots and energy points.

Although embodiments of the present invention has been described in detail, it should be understood that various changes, substitutions, and alterations can be made hereupon without departing from the principle and scope of the invention. Accordingly, the scope of the present invention should be determined by the following claims and their appropriate legal equivalents.

Moreover, the foregoing has broadly outlined certain objectives, features, and technical advantages of the present invention and a detailed description of the invention so that embodiments of the invention may be better understood in light of features and advantages of the invention as described herein, which form the subject of certain claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages are better understood from the description above when considered in connection with the accompanying figures. It is to be expressly understood, however, that such description and figures are provided for the purpose of illustration and description only and are not intended as a definition of the limits of the present invention. It will be apparent to those skilled in the art that various modifications and changes can be made within the spirit and scope of the invention as described in the foregoing specification.

What is claimed is:

1. A wells placement analysis system for a reservoir having gas condensate production from layers of a subsurface hydrocarbon reservoir, the system comprising:
   one or more processors;
   one or more input/output units adapted to be in communication with the one or more processors;
   one or more databases adapted to store and associate a plurality of reservoir metrics with a plurality of coordinates and reservoir metrics to thereby define one or more reservoir databases, the one or more reservoir databases in communication with the one or more processors;
   one or more non-transitory computer-readable mediums positioned in communication with the one or more processors and having one or more computer programs stored thereon including a set of instructions that when executed by one or more processors cause the one or more processors to perform operations of:
   generating a plurality of assessment gas condensate wells having specified production constraints at specified locations through at least one layer of the reservoir layers, the specified locations having $X_n \times Y_n \times Z_n$ coordinates;
   performing a numerical simulation of productivity in the formation layers of a selected well set comprising one or more of the plurality of assessment gas condensate wells;
   determining pseudo-pressure conditions in grid cells adjacent the selected gas condensate well set at the $X_n \times Y_n \times Z_n$ coordinates of the at least one of the layers;
   determining non-Darcy flow conditions in the grid cells adjacent the selected gas condensate well set at the $X_n \times Y_n \times Z_n$ coordinates of the at least one of the layers, based on the determined pseudo-pressure conditions in the grid cells;
   determining a productivity index for the selected gas condensate well based on the determined pseudo-pressure conditions and the determined non-Darcy flow conditions at the $X_n \times Y_n \times Z_n$ coordinates of the at least one of the layers;
   determining a total dynamic productivity index for the at least one layer for the selected gas condensate well set over a time interval of interest;

determining placement of the assessment gas condensate well set for the reservoir based on the determined the total dynamic productivity index for the assessment gas condensate well set; and generating a production analysis report for the reservoir, the production analysis report including an proposed well placement for the assessment gas condensate well set.

2. The well placement system of claim 1, wherein the at least one processor further performs operations of:
   determining a layer productivity index subject to defined well production conditions; and
   determining a total dynamic productivity index subject to defined well production conditions.

3. The well placement system of claim 1, wherein the at least one processor further performs operations of:
   determining a layer productivity index for a specified simulation run time; and
   determining a total dynamic productivity index for the specified simulation run time.

4. The well placement system of claim 1, wherein the at least one processor further performs operations of:
   determining a layer productivity index in a number of simulation runs according to a reservoir layout based on well spacing; and
   determining a total dynamic productivity index in the number of simulation runs according to the reservoir layout based on well spacing.

5. The well placement system of claim 1, wherein the at least one processor further performs operations of:
   generating a well placement map using the determined total dynamic productivity index for the at least one layer.

6. A computer-implemented method of wells placement analysis for a reservoir having gas condensate production from layers of a subsurface hydrocarbon reservoir, the computer-implemented method comprising the steps of:
   generating a plurality of assessment gas condensate wells having specified production constraints at specified locations through at least one layer of the reservoir layers, the specified locations having $X_n \times Y_n \times Z_n$ coordinates;
   performing a numerical simulation of productivity in the formation layers of a selected well set comprising one or more of the plurality of assessment gas condensate wells;
   determining pseudo-pressure conditions in grid cells adjacent the selected gas condensate well set at the $X_n \times Y_n \times Z_n$ coordinates of the at least one of the layers;
   determining non-Darcy flow conditions in the grid cells adjacent the selected gas condensate well set at the $X_n \times Y_n \times Z_n$ coordinates of the at least one of the layers, based on the determined pseudo-pressure conditions in the grid cells;
   determining a productivity index for the selected gas condensate well based on the determined pseudo-pressure conditions and the determined non-Darcy flow conditions at the $X_n \times Y_n \times Z_n$ coordinates of the at least one of the layers;
   determining a total dynamic productivity index for the at least one layer for the selected gas condensate well set over a time interval of interest;
   determining placement of the assessment gas condensate well set for the reservoir based on the determined the total dynamic productivity index for the assessment gas condensate well set; and
   generating a production analysis report for the reservoir, the production analysis report including a proposed well placement for the assessment gas condensate well set.

7. The computer-implemented method of claim 6, wherein the steps of determining a layer productivity index and determining a total dynamic productivity index are performed subject to defined well production conditions.

8. The computer-implemented method of claim 6, wherein the steps of determining a layer productivity index and determining a total dynamic productivity index are performed for a specified simulation run time.

9. The computer-implemented method of claim 6, wherein the steps of determining a layer productivity index and determining a total dynamic productivity index are performed in a number of simulation runs according to a reservoir layout based on well spacing.

10. The computer-implemented method of claim 6, further including the step of:
   generating, by one or more processors, a well placement map using the determined total dynamic productivity index for the at least one layer.

* * * * *